(12) United States Patent
Choi et al.

(10) Patent No.: US 9,755,016 B2
(45) Date of Patent: Sep. 5, 2017

(54) INTEGRATION PROCESS TO FORM MICROELECTRONIC OR MICROMECHANICAL STRUCTURES

(71) Applicant: GLOBALFOUNDRIES Inc., Grand Cayman (KY)

(72) Inventors: Samuel S. Choi, Fishkill, NY (US); Wai-Kin Li, Herent (BE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/088,592

(22) Filed: Apr. 1, 2016

(65) Prior Publication Data

US 2016/0322458 A1    Nov. 3, 2016

Related U.S. Application Data

(62) Division of application No. 13/859,966, filed on Apr. 10, 2013, now Pat. No. 9,337,261.

(51) Int. Cl.
| | |
|---|---|
| *H01L 23/52* | (2006.01) |
| *H01L 29/06* | (2006.01) |
| *H01L 21/033* | (2006.01) |
| *H01L 21/308* | (2006.01) |
| *H01L 21/311* | (2006.01) |
| *H01L 23/525* | (2006.01) |
| *H01L 21/768* | (2006.01) |

(52) U.S. Cl.
CPC ...... *H01L 29/0657* (2013.01); *H01L 21/0337* (2013.01); *H01L 21/3086* (2013.01); *H01L 21/31144* (2013.01); *H01L 21/76816* (2013.01); *H01L 23/5256* (2013.01); *H01L 2924/0002* (2013.01)

(58) Field of Classification Search
None
See application file for complete search history.

(56) References Cited

U.S. PATENT DOCUMENTS

| 5,510,645 A | 4/1996 | Fitch et al. |
| 5,550,076 A | 8/1996 | Chen |
| | (Continued) | |

OTHER PUBLICATIONS

Pearson, et al. "Coaxial Interconnections Using Advanced Metallurgy Technology". IBM Technical disclosure. IP.com database, published Sep. 1, 1989.

*Primary Examiner* — Shaun Campbell
(74) *Attorney, Agent, or Firm* — Yuanmin Cai; Hoffman Warnick LLC

(57) ABSTRACT

The invention relates to transferring, in one exposure, a single-mask feature to form two features on an underlying material. Specifically, a doubled walled structure (i.e. a center opening flanked by adjacent openings) is formed. Advantageously, the openings may be sub-resolution openings. The center opening may be a line flanked by two other lines. The center opening may be circular and surrounded by an outer ring, thus forming a double wall ring structure. In an electronic fuse embodiment, the double wall ring structure is a via filled with a conductor that contacts a lower and upper level metal. In deep trench embodiment, the double wall ring structure is a deep trench in a semiconductor substrate filled with insulating material. In such a way the surface area of the trench is increased thereby increasing capacitance.

20 Claims, 13 Drawing Sheets

(56) References Cited

U.S. PATENT DOCUMENTS

| | | | |
|---|---|---|---|
| 5,656,532 A * | 8/1997 | Tseng | H01L 27/10852 257/E21.648 |
| 5,789,316 A | 8/1998 | Lu | |
| 6,784,045 B1 * | 8/2004 | Price | H01L 21/76877 257/209 |
| 6,963,483 B2 | 11/2005 | Chakravorty et al. | |
| 2001/0055867 A1 | 12/2001 | Lee | |
| 2004/0132292 A1 | 7/2004 | Mariani et al. | |
| 2008/0258207 A1 * | 10/2008 | Radosavljevic | H01L 29/41791 257/327 |
| 2011/0095435 A1 * | 4/2011 | Volant | H01L 21/76898 257/774 |
| 2011/0121427 A1 | 5/2011 | Strupar et al. | |
| 2011/0241167 A1 * | 10/2011 | Feustel | H01L 21/76811 257/532 |
| 2011/0303986 A1 | 12/2011 | Yang | |
| 2014/0091476 A1 * | 4/2014 | Nyhus | H01L 23/5226 257/774 |
| 2014/0264932 A1 * | 9/2014 | Ting | H01L 21/76898 257/774 |

\* cited by examiner

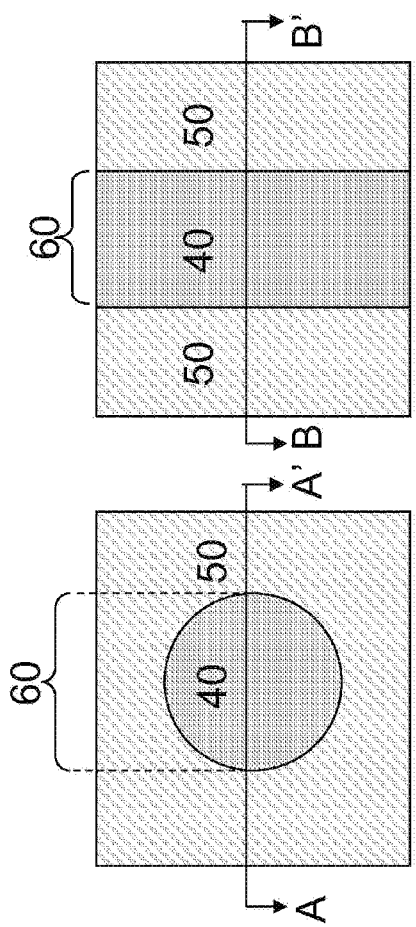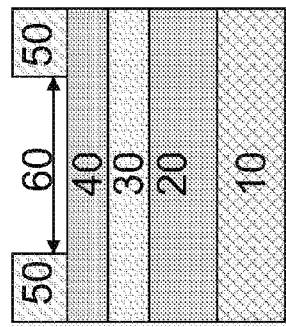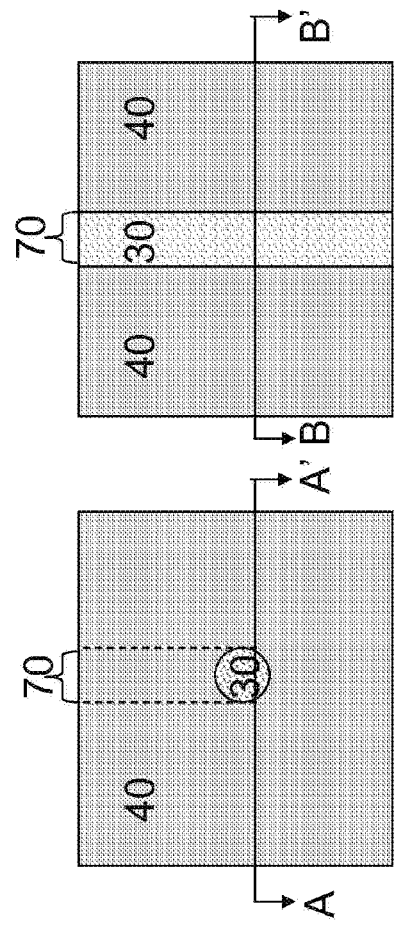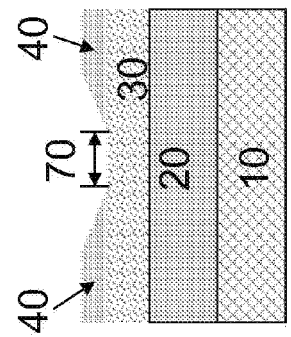

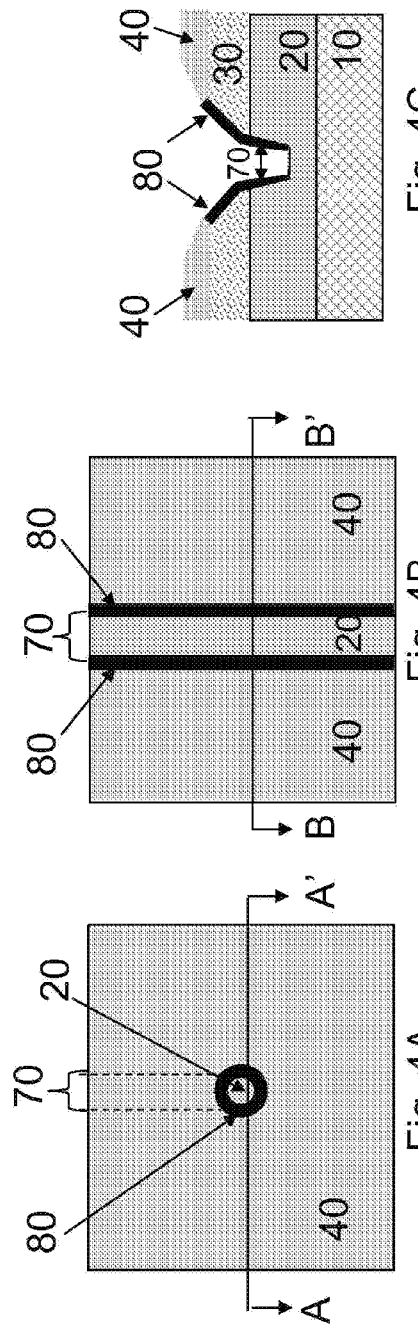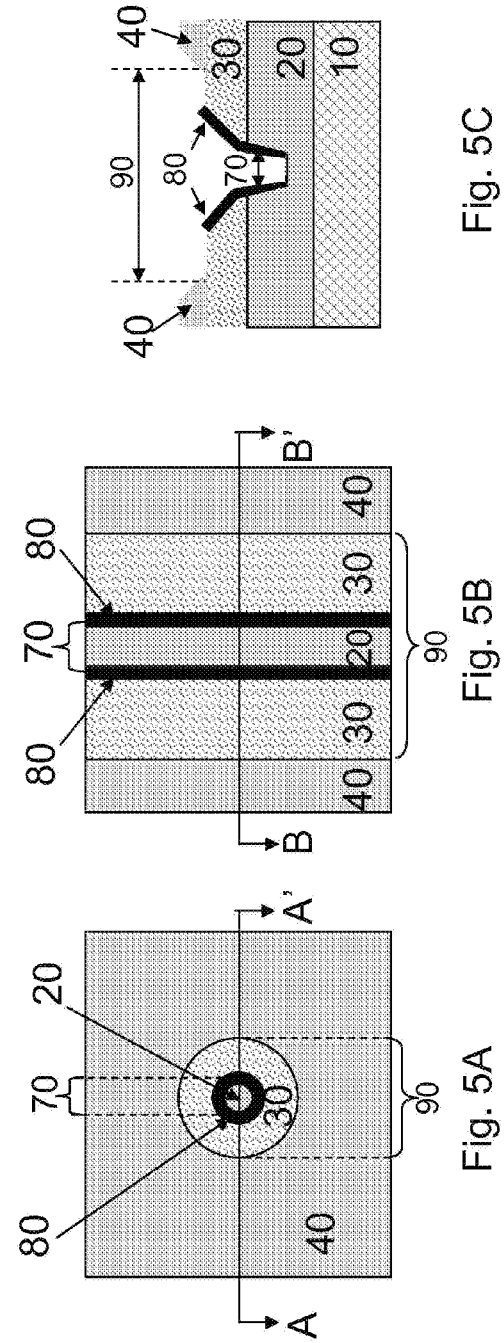

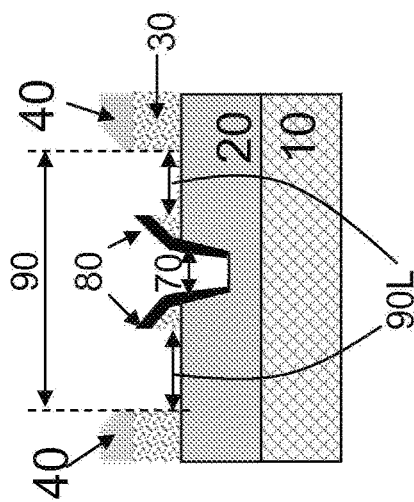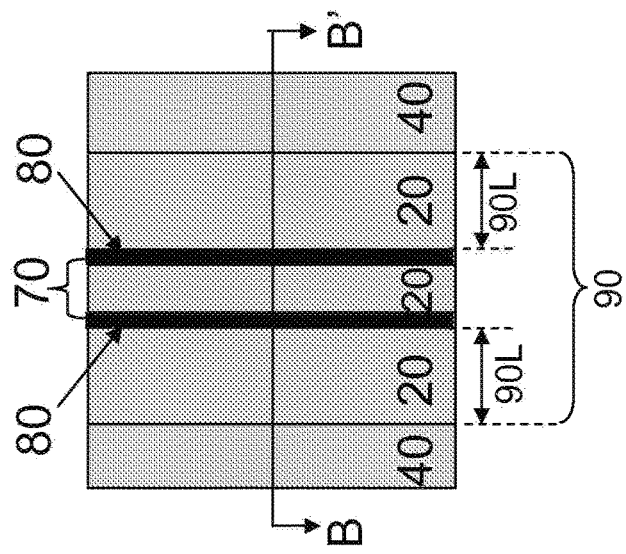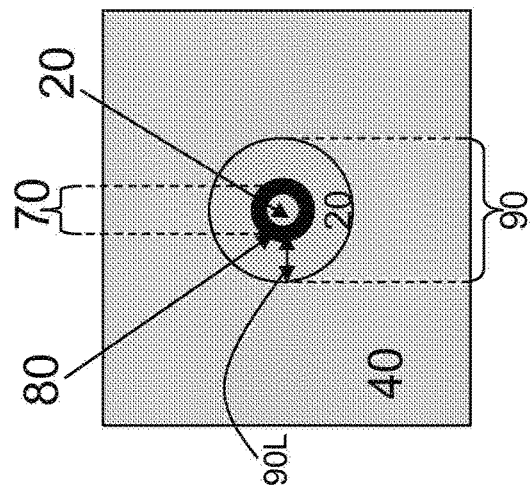

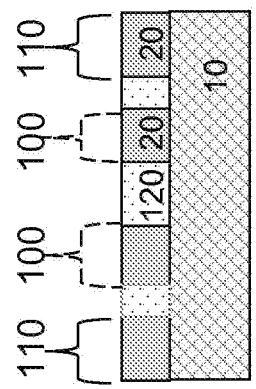
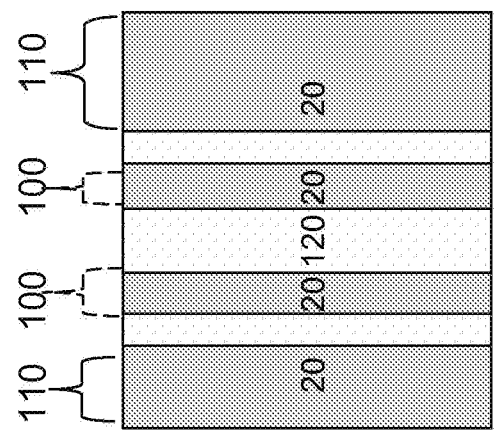
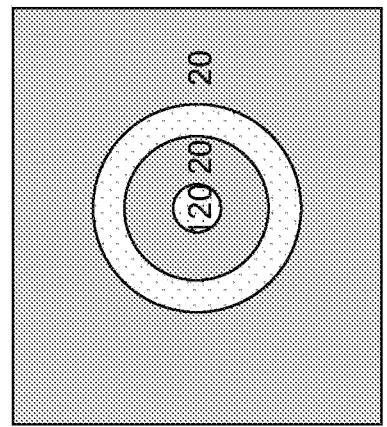

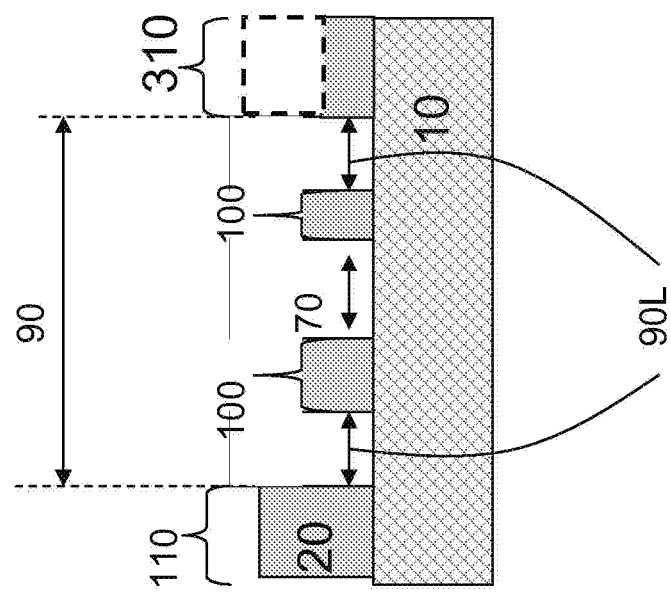
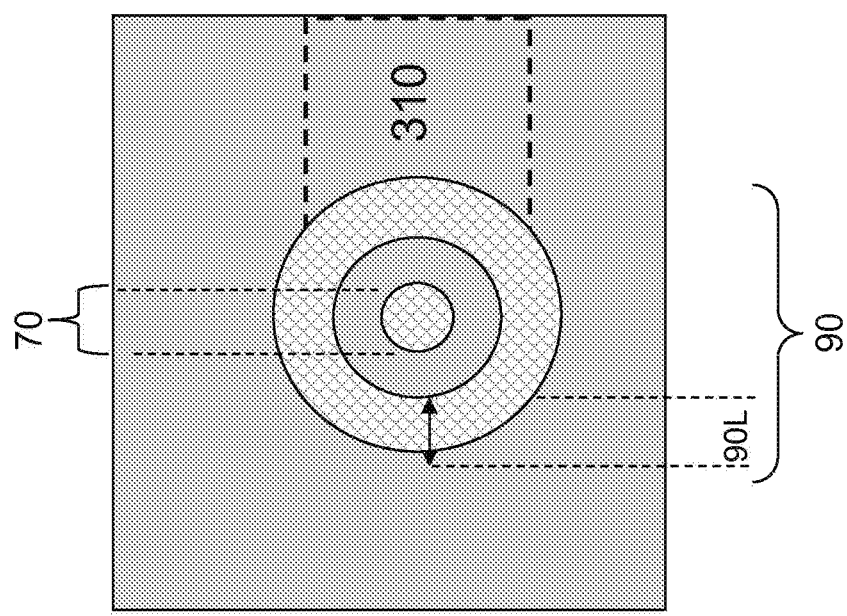

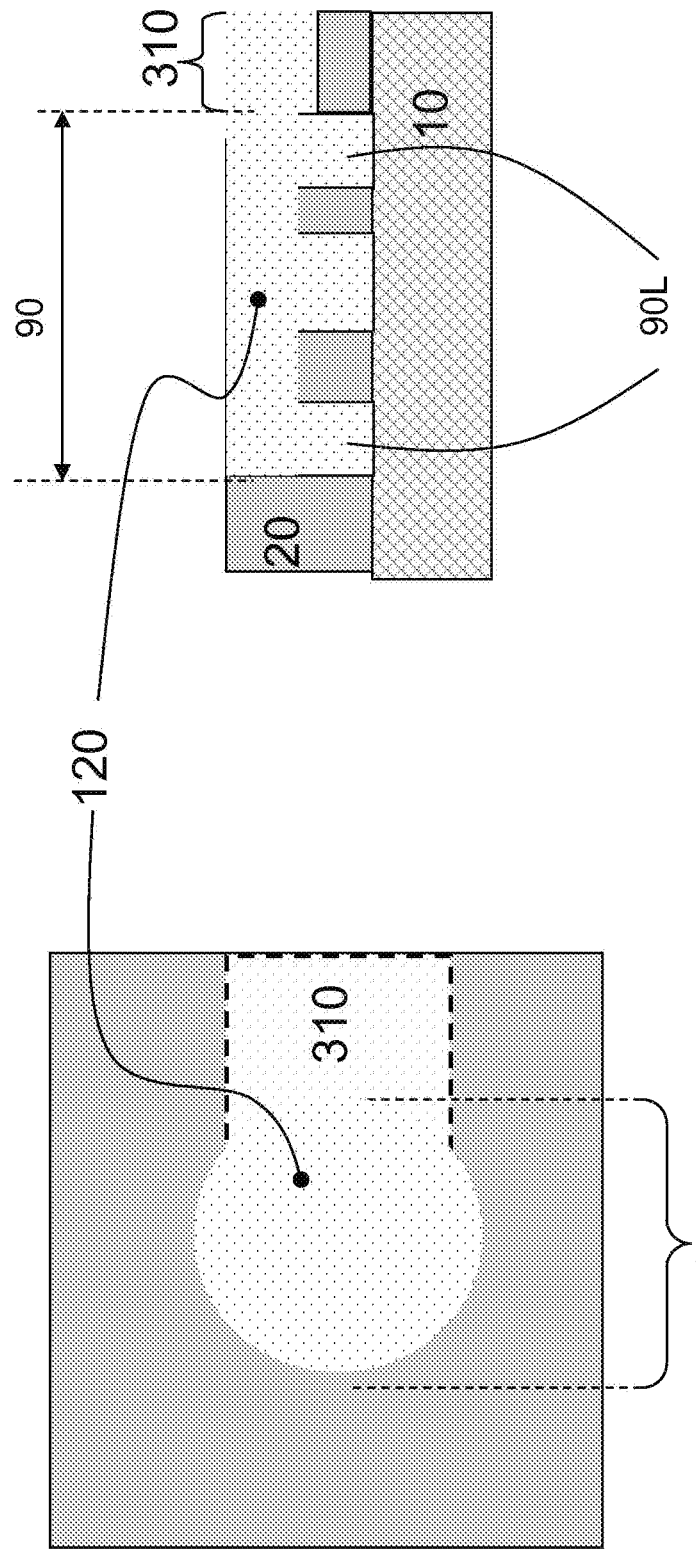

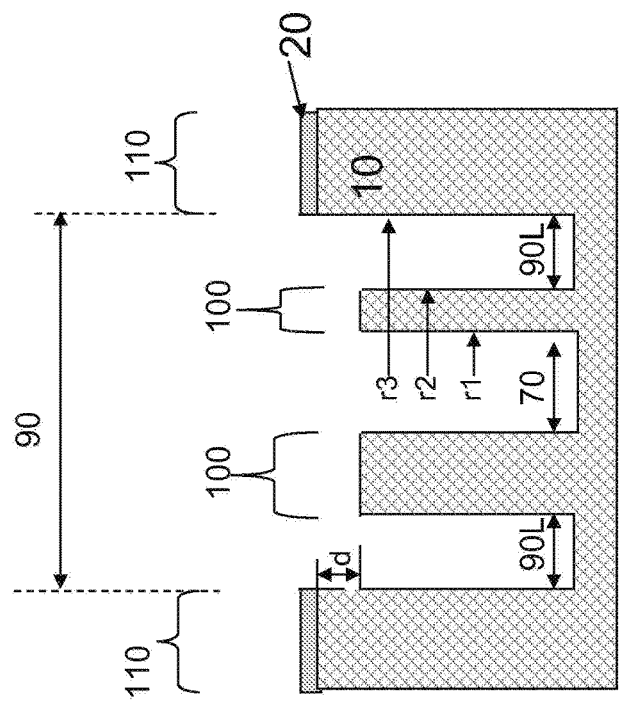
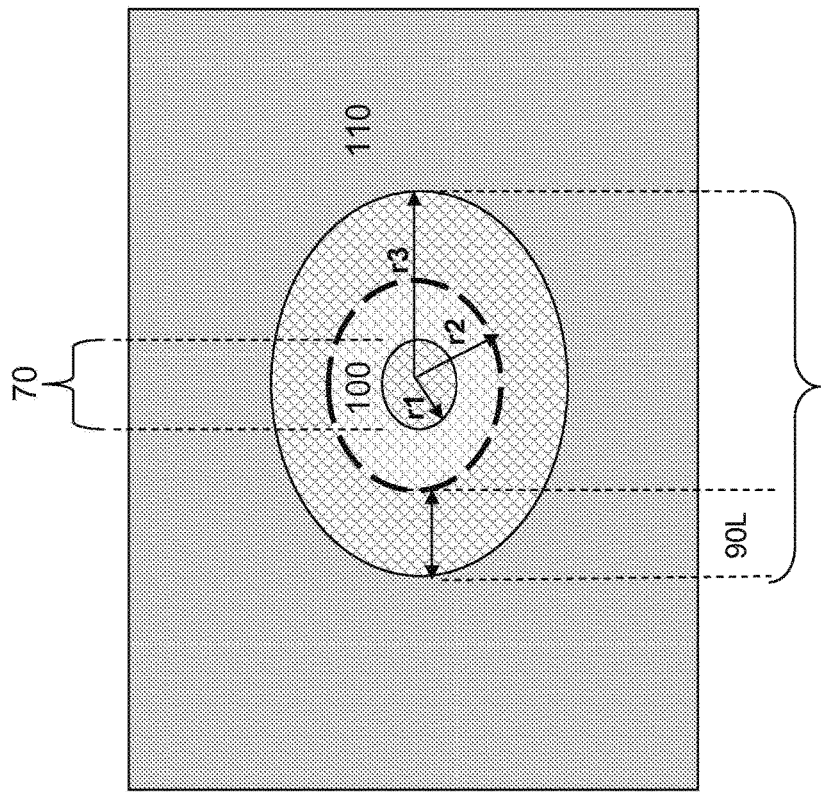
Fig. 14A
Fig. 14B

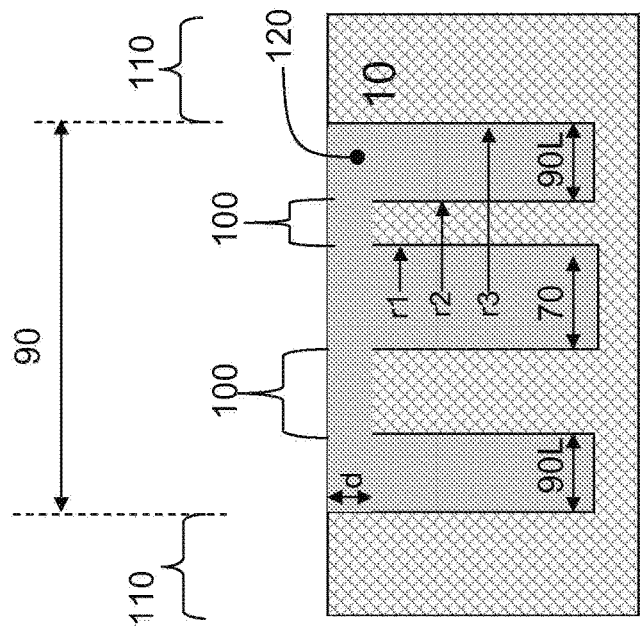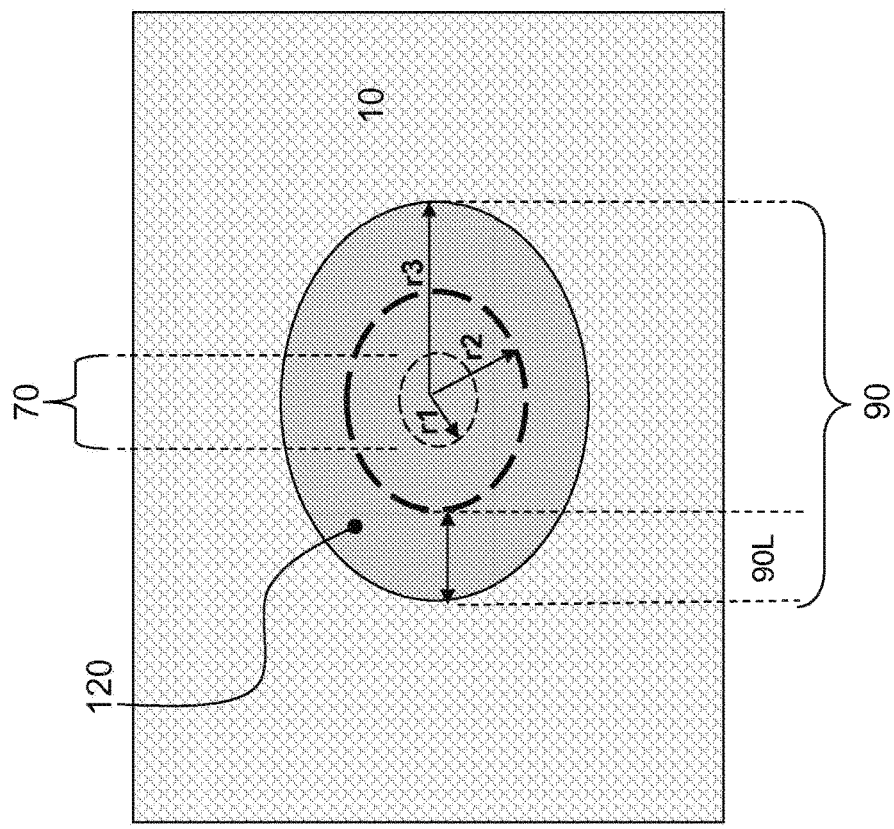
Fig. 15A
Fig. 15B

INTEGRATION PROCESS TO FORM MICROELECTRONIC OR MICROMECHANICAL STRUCTURES

BACKGROUND OF THE INVENTION

Field of the Invention

The present invention generally relates to microelectronic or micromechanical structures. In particular, the invention relates to transferring, in one exposure, a single-mask feature to form two features on an underlying material. Specifically, a doubled walled structure (i.e. an opening flanked by adjacent openings) is formed. Advantageously, the openings may be sub-resolution openings.

Description of Related Art

In fabricating microelectronic of micromechanical devices, structures are formed by overlying a photoresist above a material to be patterned. A mask having a pattern is then used to expose the photoresist to electromagnetic radiation (light). The exposed photoresist is developed so that the pattern from the mask transfers to the photoresist. The patterned photoresist now becomes the resist mask through which the underlying material is etched, thus transferring the pattern to the underlying material. The resist is removed resulting in a patterned material. The pattern in the material matches the pattern of the mask, meaning if there are three features/shapes on the mask, then three are transferred to the material. Furthermore, the feature size that can be transferred to the material is limited by the resolution of the optical system used to transfer the pattern from the mask to the resist.

However, the present invention allows for patterning of multiple features on a material despite the mask having a single feature. Furthermore, the present invention allows for transfer of sub-resolution feature(s) to the underlying material.

BRIEF SUMMARY OF THE INVENTION

An object of the invention is to provide double walled structure, preferably a sub-resolution double walled structure.

According to a further aspect of the invention the double wall structure has a center opening flanked by mirror image openings on either side.

In one aspect the center opening is a circle and the flanked opening form a ring around the center opening, thus forming a coaxial structure.

In one aspect of the invention, the coaxial structure is a capacitor.

In on aspect the coaxial structure is a deep trench capacitor.

In one aspect the coaxial structure is a via of a back end of line structure.

In another aspect, the center opening of the double wall structure is a rectangle or line which is flanked by lines on either side of the center line.

According to another aspect of the invention, a method of making a double wall structure using a single photomask feature using a single exposure is provided.

Further aspect of the invention is a vertical e-fuse structure having a double walled structure for a portion of the via.

An advantage of the present invention is the printing of a double wall feature. The double wall feature may be a coaxial feature or a line feature with flanking lines.

A further advantage is that the features may be sub-resolution.

Another advantage is the double wall features can be created using a single feature on a single mask.

Yet another advantage is the double wall features are self-aligned.

Other characteristics and advantages of the invention will become obvious in combination with the description of accompanying drawings, wherein the same number represents the same or similar parts in all figures.

BRIEF DESCRIPTION OF THE SEVERAL VIEWS OF THE DRAWINGS

FIG. 2A illustrates top down view of an embodiment of the current invention after patterning photoresist with a circle feature according to a method step in an embodiment of the present invention;

FIG. 2B illustrates top down of an embodiment of the current invention after patterning photoresist with a line feature according to a method step in an embodiment of the present invention;

FIG. 2C illustrates cross section view of the embodiments of FIGS. 2A and 2B;

FIGS. 3A and 3B illustrate top down views of two embodiments of the current invention during an early stage of the first etch according to a method step in an embodiment of the present invention;

FIG. 3C illustrates cross section view of the embodiments of FIGS. 3A and 3B;

FIGS. 4A and 4B illustrate top down views of two embodiments of the current invention during a later stage of the first etch according to a method step in an embodiment of the present invention;

FIG. 4C illustrates cross section view of the embodiments of FIGS. 4A and 4B;

FIGS. 5A and 5B illustrate top down views of two embodiments of the current invention after partial removal of the upper hardmask by a second etch according to a method step in an embodiment of the present invention;

FIG. 5C illustrates cross section view of the embodiments of FIGS. 5A and 5B;

FIGS. 6A and 6B illustrate top down views of two embodiments of the current invention after the early stages of a third etch according to a method step in an embodiment of the present invention;

FIG. 6C illustrates cross section view of the embodiments of FIGS. 6A and 6B;

FIGS. 9A and 9B illustrate top down views of two embodiments of the current invention after filling the openings and fully polishing according to a method step in an embodiment of the present invention;

FIG. 9C illustrates cross section view of the embodiments of FIGS. 9A and 9B;

FIG. 11A illustrate a top down view of an embodiment of the current e-fuse invention after forming an upper level metal opening;

FIG. 11B illustrates cross section view of the embodiment of FIG. 11A;

FIG. 12A illustrate at op down view of an embodiment of the current e-fuse invention after filling an upper level metal opening and via opening with conductor material and planarizing;

FIG. 12B illustrates cross section view of the embodiment of FIG. 12A;

FIG. 14A illustrate at op down view of an embodiment of the double-wall deep trench structure after transferring the double wall pattern to the target material;

FIG. 14B illustrates cross section view of the embodiment of FIG. 14A;

FIG. 15A illustrates a top down view of an embodiment of double-wall deep trench structure; and FIG. 15B illustrates cross section view of the embodiment of FIG. 15A.

DETAILED DESCRIPTION OF THE INVENTION

Figure 1:
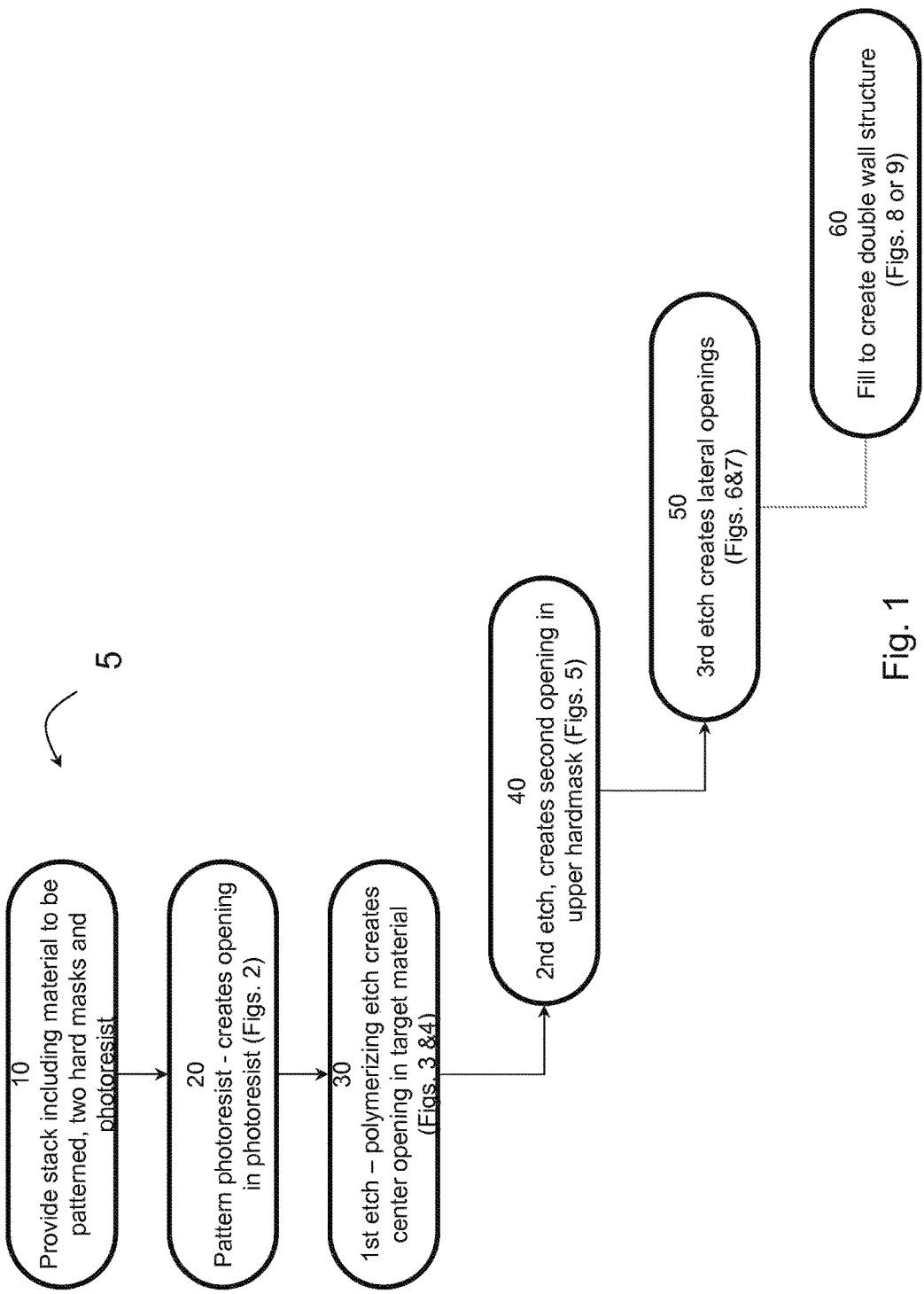
FIG. 1 is a flow chart of the method of creating a double-walled structure according to one embodiment.

The basic principle of the invention is a method of patterning a double-walled feature using a single mask feature wherein the patterned feature may be sub-resolution. A generic method to form double walled features (both coaxial openings and a line opening with flanking lines) will be described in conjunction with FIGS. 1-9.
Additional structures which can be built using the generic method will be described in conjunction with FIGS. 10-12 and 13-15. A detailed description of the invention is made in combination with the following embodiments.
Methods
FIG. 1 is a high-level flow chart 5 with the steps of creating a double-walled structure, preferably a sub-resolution double walled structure, using a single exposure of a single mask feature.

In step 10, a starting stack of materials is provided. The starting stack includes at least the material to be patterned (herein referred to as "target material"), two hardmasks and a photoresist layer.

In step 20, the photoresist is patterned to create an opening in the photoresist. This photoresist opening is within the resolution limits of the optical system.

In step 30, a first etch thins the upper hardmask and makes a center opening in the upper hardmask. The center opening in the upper hardmask is smaller than the photoresist opening, and in a preferred embodiment, is sub-resolution. The etching continues to transfer the center opening into the material to be patterned (i.e. the target material). Making a smaller center opening in the upper hardmask is possible due to the polymerizing nature of the first etch which is further explained later.

In step 40, thinned portions of the upper hardmask are removed by a second etch to create a second opening overlying the center opening. The second opening reveals a portion of the lower hardmask, polymer build up from the first etch and the center opening in the lower hardmask.

In step 50, a third etch uses the polymer as a mask to (i) further etch the center opening and (ii) create lateral openings in the lower hardmask on either side of the center opening. The third etch continues to (i) further etch the center opening in the target material and (ii) transfers the lateral openings in the target material. At this point, an unfilled double wall structure now exists in the target material.

In step 60, the double wall structure can then be filled and polished to create various useful structures which are further described later.

Each of the steps of creating a double-walled structure will be discussed in more detail in conjunction with FIGS. 2A-9C.

Referring to FIGS. 2A, 2B, and 2C illustrate step 20 patterning a photoresist above the starting stack of materials. FIGS. 2A and 2B are top down views of stack according to two different embodiments. FIG. 2C is a cross-sectional view of the stack through line A-A' and B-B' of FIGS. 2A and 2B.

Referring to FIG. 2C, the stack of materials, from bottom up, include at least a substrate 10, a target material 20, a lower hardmask 30, a upper hardmask 40, and photoresist 50 having an opening 60.

The substrate 10 can be any material and merely refers to the material which supports the target material 20. Alternatively, there can be no substrate 10. The substrate can be a semiconductor, a ceramic, an insulator, a metal, or a multi-layered structure combining one or more of the aforementioned materials. The substrate can include layers of materials. In a preferred embodiment, the substrate 10 etches more slowly than the target material 20, preferably to act as an etch stop.

The target material 20 refers to the material to which the double-walled structure will be transferred. The target material 20 can be a semiconductor, an insulator, a metal or a combination of one or more of the aforementioned materials. For the purposes of illustration, the figures will be described using an insulator target material 20 embodiment, preferably a low-k insulator including silicon and oxygen.

The lower hardmask 30 can be a semiconductor, an insulator or a metal. For the purposes of illustration, the figures will be described using an insulator lower hardmask 30 embodiment, preferably a TEOS hardmask (i.e. a $SiO_2$ film deposited by plasma enhanced chemical vapor deposition using a tetraethylorthosilicate (TEOS) precursor).

The upper hardmask 40 can be a semiconductor, an insulator or a metal. For the purposes of illustration, the figures will be described using a metal upper hardmask 40 embodiment, preferably a titanium nitride (TiN) hardmask.

The photoresist 50 has an opening 60 whose size is limited by the optical resolution of the photolithography system. The opening 60 can have various shapes which depend upon the feature of the photolithographic mask used. In the embodiments shown in Figs. A and B, a circle and line are shown, respectively.

Referring to FIG. 2A, the shape of the opening 60 patterned in the photoresist 50 is circular such as those shapes commonly used as vias in microelectronic applications. In FIG. 2B, the shape of the opening 60 patterned in the photoresist 50 is rectangular such as those shapes commonly used as lines in microelectronic applications. In each of FIGS. 2A, 8B and 8C, the opening 60 in the photoresist 50 reveal the underlying upper hardmask 40.

Referring to FIGS. 3A, 3B, and 3C illustrate the early stages of the first etch of step 30. FIGS. 3A and 3B are top down views of stack during an early stage of the first etch according to two different embodiments. FIG. 3C is a cross-sectional view of the stack during an early stage of the first etch through line A-A' and B-B' of FIGS. 3A and 3B.

Referring to FIG. 3C, the stack of materials are the same as described in FIG. 2C with the exception that the photoresist 50 has been removed. As illustrated in FIG. 3C, during the early stages of the first etch, the first etch thins the upper hardmask 40 in a tapering fashion to form a center opening 70 in the upper hardmask 40. Due to the nature of the etch (further described later), the center opening 70 is smaller than the opening 60 that was previously formed in the photoresist. Thus, the center opening 70 may be a sub-resolution opening. Accordingly, the first etch shrinks the photoresist opening 60 and transfers a substantially smaller pattern into the upper hardmask 40. The first etch may shrink the photoresist opening 60 by a factor of about 2× to about 5× and ranges therebetween when creating the center opening 70.

Referring to FIG. 3A, the shape of the photoresist opening 60 has been transferred to the upper hardmask 40 as center opening 70. The opening remains circular such as those shapes commonly used as vias in microelectronic applications, but as previously discussed, is substantially smaller. In FIG. 3B, the shape of the photoresist opening 60 has been transferred to the upper hardmask 40 as center opening 70. The opening remains rectangular such as those shapes commonly used as lines in microelectronic applications. In each of FIGS. 3A, B and C, the center opening 70 in the upper hardmask 40 reveals the underlying lower hardmask 30.

FIGS. 4A, 4B, and 4C illustrate the later stages of first etch step 30. FIGS. 4A and 4B are top down views of stack during the later stages of the first etch according to two different embodiments. FIG. 4C is a cross-sectional view of the stack during the later stages of the first etch through line A-A' and B-B' of FIGS. 4A and 4B.

Referring to FIG. 4C, the stack of materials are the same as described in FIG. 3C. As illustrated in FIG. 4C, during the later stages of the first etch, the first etch continues to thin the upper hardmask 40 in a tapering fashion. In addition, the center opening 70 has been transferred through the lower hardmask 30 and into the target material 20. The first etch etches lower hardmask 30 in a tapering fashion similar to the upper hardmask 40. The nature of the etch results in the formation of polymer 80 on the sidewalls of the center opening 70. The polymer formation allows the center opening 70 to be transferred to the target material 20 such that it is smaller than the opening 60 that was previously formed in the photoresist. Thus, the center opening 70 may also be a sub-resolution opening as it appears in the target material 20. Accordingly, the first etch shrinks the photoresist opening 60 and transfers a substantially smaller pattern into the target material 20. The first etch may shrink the opening 60 by a factor of about 2× to about 5× and ranges therebetween when creating the center opening 70 in the target material.

Referring to FIG. 4A, the shape of the opening 60 in the photoresist 50 has been transferred to the target material 20 as center opening 70. The opening remains circular such as those shapes commonly used as vias or deep trench capacitors in microelectronic applications, but can be substantially smaller, as previously discussed. In FIG. 4B, the shape of the opening 60 in the photoresist 50 has been transferred to the target material 20 as center opening 70. The opening remains rectangular such as those shapes commonly used as lines in microelectronic applications.

As previously stated, the first etch is a polymerizing etch. Using the preferred embodiment materials, an example first polymerizing etch includes fluorocarbons, for example CF4 with a mix of oxygen and/or argon. With such chemistry, a TiN upper hard mask 40 is oxidized to $TiO_2$ which is removed while generating a by-product polymer 80 on the sidewalls. The by-product polymer 80 formed on the sidewalls shrinks the opening from the photoresist opening 60 to center opening 70. The polymer 80 by-product lining the sidewalls of the center opening 70 serves as a mask in later steps because it can withstand many types of etches.

FIGS. 5A, 5B, and 5C illustrate the partial removal of the upper hardmask 40. FIGS. 5A and 5B are top down and FIG. 5C is a cross-sectional view of the stack during the later stages of the first etch through line A-A' and B-B' of FIGS. 5A and 5B.

Referring to FIG. 5C, the stack of materials are the same as described in FIG. 4C. As illustrated in FIG. 5C, the upper hardmask 40 has been partially removed. In particular the regions thinned/tapered by the first etch have been removed. The result is a second opening 90 in the upper hardmask which is (i) larger than, and (ii) overlays the center opening 70. The second opening 90 is slanted such that the top critical dimension ("CD") of upper hardmask 40 will be larger than the original photoresist opening 60, and the bottom CD of upper hardmask 40 will be much smaller than the original photoresist opening 60. In the case of equal space of three lines, ideally, the second opening 90 will be controlled by a subsequent wet process (dilute HF, for example) and indirectly related to the 2× to 5× shrink process. For example, the more shrinking (for example, 5×) the larger second opening 90 will be due thinner hardmask film. The less shrinking (for example 2×), the smaller second opening 90 will be due to thicker upper hardmask film 40. The upper hardmask 40 may be removed by a wet etch. In the preferred embodiment in which the upper hardmask 40 is TiN, the thinned portions of the upper hardmask 40 are removed by diluted HF or citric HF.

Referring to FIG. 5A, the shape of the opening 60 in the photoresist 50 has been transferred to the upper hardmask 40 as second opening 90. The opening remains circular such as those shapes commonly used as vias in microelectronic applications, but is substantially smaller, as previously discussed. In FIG. 5B, the shape of the opening 60 in the photoresist 50 has been transferred to the upper hardmask 40 as second opening 90. The opening remains rectangular such as those shapes commonly used as lines in microelectronic applications. In each of FIGS. 5A, 5B and 5C, the second opening 90 in the upper hardmask 40 reveals the underlying lower hardmask 30.

FIGS. 6A, 6B, and 6C illustrate the early stages of third etch step 50 which creates lateral openings 90L in the lower hardmask 30. FIGS. 6A and 6B are top down views of stack during the early stages of the third etch according to two different embodiments. FIG. 6C is a cross-sectional view of the stack during the early stages of the third etch through line A-A' and B-B' of FIGS. 6A and 6B.

Referring to FIG. 6C, the stack of materials are the same as described in FIG. 3C. As illustrated in FIG. 6C, during the early stages of the third etch, the third etch removes the lower hard mask 30 to create lateral openings 90L in the lower hardmask 30 on either side of the center opening 70. In addition, the center opening 70 may continue to be transferred into the target material 20.

Referring to FIG. 6A, the top down view shows a center opening 70 in the target material 20 surrounded by polymer 80 which in turn is surrounded by lateral opening 90L to form a bull's eye pattern.

Referring to FIG. 6B, the top down view shows a center opening 70 in the target material 20 lined by polymer 80 which in turn is lined by lateral opening 90L to form a trench pattern.

Figure 7C:
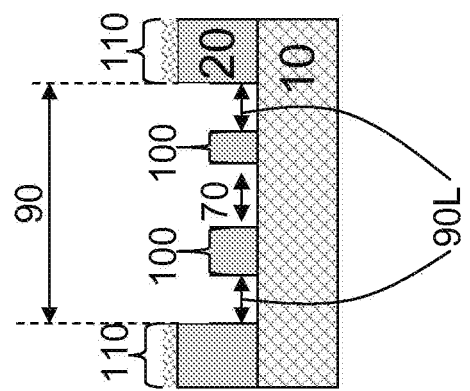
FIG. 7C illustrates cross section view of the embodiments of FIGS. 7A and 7B.
Figure 7B:
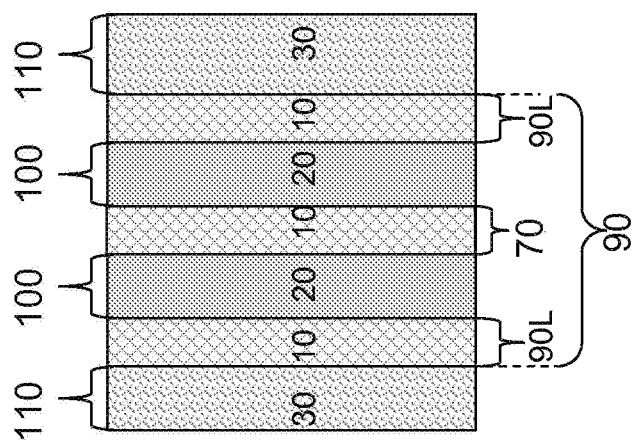
FIGS. 7A and 7B illustrate top down views of two embodiments of the current invention after a late stage of the third etch according to a method step in an embodiment of the present invention.
Figure 7A:
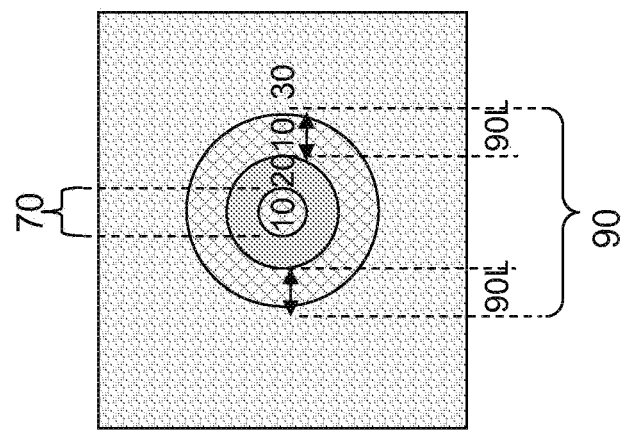

FIGS. 7A, 7B, and 7C illustrate the later stages of third etch step 50 which creates lateral openings 90L in the target material 20. FIGS. 7A and 7B are top down views of stack during the later stages of the third etch according to two different embodiments.

FIG. 7C is a cross-sectional view of the stack during the later stages of the third etch through the center of FIGS. 7A and 7B.

Referring to FIG. 7C, the stack of materials are the same as described in FIG. 3C. As illustrated in FIG. 7C, during the later stages of the third etch, the third etch removes the target material 20 to create lateral openings 90L on either side of the center opening 70. In addition, the center opening 70 may continue to be transferred into the target material 20. Furthermore, the polymer 80, which separated the center opening from the lateral openings 90L is removed in the later stages of the third etch to expose an inner wall 100 of target material 20. This inner wall 100 of target material 20 which was previously shielded by the polymer 80 can now be etched. Thus, as shown in the embodiment of FIG. 7C, the inner wall 100 target material 20 is lower than the target material contiguous with the opening 90. This target material contiguous with opening 90 is the outer wall 110.

Referring to FIG. 7A, the top down view shows a center opening 70 in the target material 20 exposing the substrate 10. The center opening is surrounded by the inner wall 100 of target material 20. The inner wall 100, in turn, is surrounded by lateral opening 90L exposing the substrate 10 to form a bull's eye pattern.

Referring to FIG. 7B, the top down view shows a center opening 70 in the target material 20 exposing the substrate 10. The center opening 70 is flanked by inner wall 100 of target material 20. The inner wall 100, in turn, is flanked by lateral openings 90L exposing the substrate 10 to form a double wall trench pattern. In an embodiment lateral regions 90L can be at least 5 nm wide but will ultimately depend upon the erosion rate of polymer 80 (See FIG. 6C). In an embodiment, center opening 70 can be 5-20 nm, but can be larger, if desired, depending upon application.

The third etch is preferably a reactive ion etch with a fluorine-containing chemistry, preferably $CF_4$. In addition, in a preferred embodiment, the third etch is selective to the substrate 10.

Figure 8A:
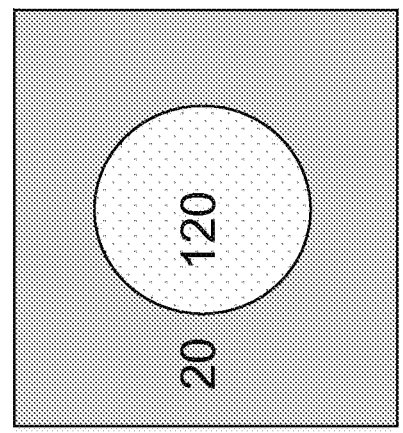
FIGS. 8A and 8B illustrate top down views of two embodiments of the current invention after filling the openings and partially polishing according to a method step in an embodiment of the present invention.
Figure 8B:
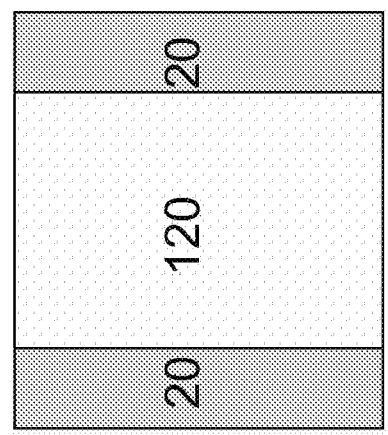
Figure 8C:
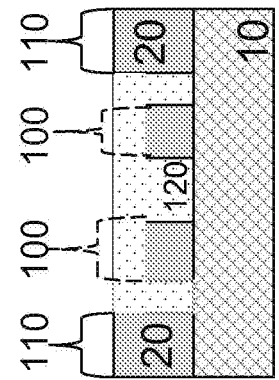
FIG. 8C illustrates cross section view of the embodiments of FIGS. 8A and 8B.
Figure 10:
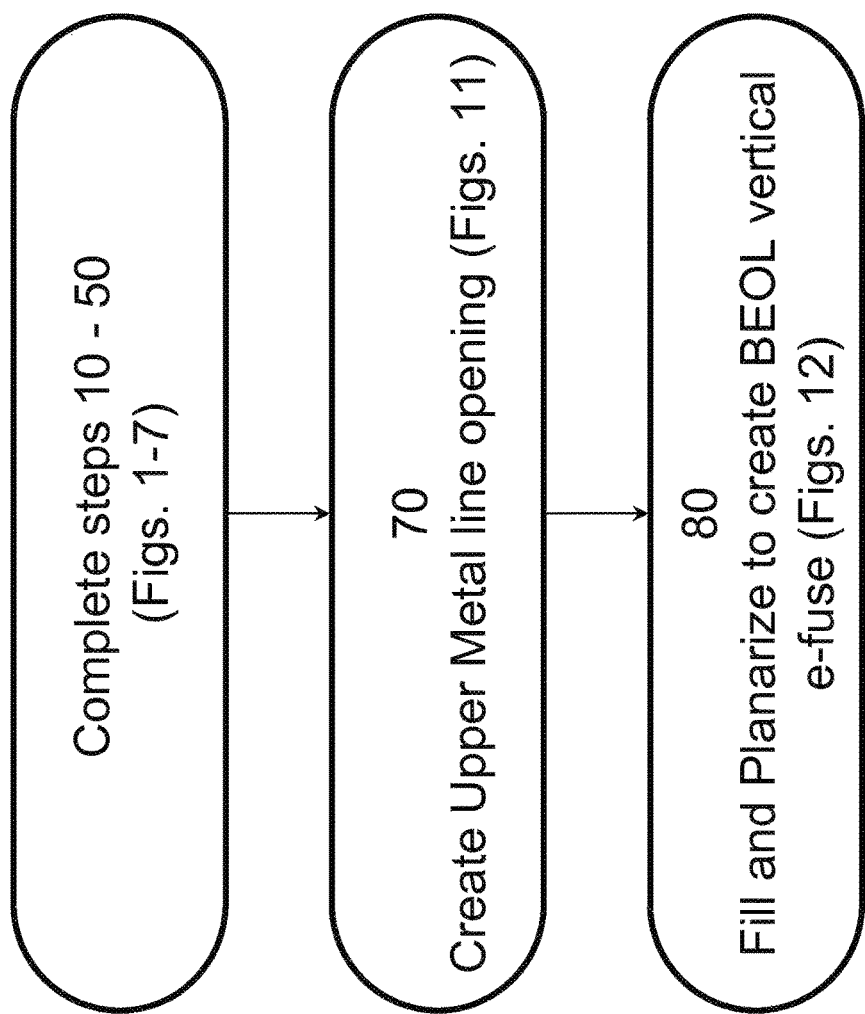
FIG. 10 is a flow chart of the method of creating a double-walled e-fuse structure according to one embodiment.

FIGS. 8A-8C are top down and cross-section views of the previous figures after filling openings in the target material with a fill material 120 and partially planarizing. FIG. 8C is a cross-sectional view of the stack through the center of FIGS. 8A and 8B after filling openings in the target material with a fill material 120 and partially planarizing.

Referring to FIG. 8C, the fill material is partially planarized such that it is co-planar with the target material 20 at the outer wall 110 while the fill material covers the target material 20 of the lower inner wall 100. Thus, both the center opening 70 and the lateral openings 90L are filled and the inner wall 100 is covered with fill material. From a top down perspective, FIG. 8A appears to be a circle of fill material 120 surrounded by target material 20. Therefore, from a top down view, only outer wall 110 is visible. Similarly, the top down view of FIG. 8B shows a rectangle (or line) of fill material 120 bordered by target material 20.

The fill material 120 can be any type of material, i.e. dielectric, conductor, etc. and will depend upon the particular embodiment. The fill material 120 may be a single layer or an aggregate of layers. Likewise the target material 20 may be a single layer or an aggregate of layers.

FIGS. 9A-9C are top down and cross-section views of the previous figures after filling openings in the target material with a fill material 120 and fully planarizing. FIG. 9C is a cross-sectional view of the stack through the center of FIGS. 9A and 9B after filling openings in the target material with a fill material 120 and fully planarizing.

Referring to FIG. 9C, the fill material is fully planarized such that it is co-planar with the target material 20 at both the inner 100 and outer wall 110. Thus, both the center opening 70 and the lateral openings 90L are filled while both the top of the inner walls 100 and outer walls 110 are exposed (i.e. not covered by fill material 120). From a top down perspective, FIG. 9A appears to be a bull's eye or stated another way, it is a double walled ring structure. Thus, from a top down view, bother inner 100 and outer walls 110 are visible. Similarly, the top down view of FIG. 9B shows three lines of fill material 120 with intervening target material 20.

The above methods form a self-aligned sub-resolution double wall ring patterns (FIG. 9A) wherein the there is a filled center opening bounded by an inner wall, and filled lateral ring surrounded by an outer wall. The above methods may also be used to form self-aligned sub-resolution double line patterns (FIG. 9A) wherein the there is a filled center line bounded by inner walls, and filled lateral lines bounded by the inner and outer walls. These self-aligned sub-resolution structures may be used as an alternative line/space process solution for sidewall image pattern transfer, may be used to form an e-fuse structure, may be used to increase the surface area for deep trenches, or may be used for other useful structures.

With respect to the sidewall image transfer (SIT), the invention herein can be used to replace currently known sidewall image transfer techniques. The advantage of the current invention is that only one lithography step is needed. In addition, in the present invention the final shape is dictated by control of reactive ion etching in conjunction with hard mask layer thicknesses, whereas in known SIT techniques more processes are implicated and must be controlled such as chemical mechanical polishing and more lithography steps. SIT processes also suffer from pattern collapse and resulting edge rougheining. Also, a SIT process cannot make vias because it is a bright field process, whereas the current invention can be used in dark field and can be used to make via structures.

With respect to an embodiment of forming an e-fuse structure, a vertical e-fuse in a back end of line (BEOL) interconnect structure is discussed in conjunction with FIGS. 12A-12B. FIG. 12A gives the process flow, initially, the fabrication steps are the same as shown in FIG. 1A through FIG. 7C. Then, in step 7C, an upper metal line opening is formed. In step 8C the upper metal line and via structure is filled with conductor and planarized.

Referring to FIG. 7C, in a BEOL e-fuse embodiment, the substrate 10 would comprise a lower level line (Mx), The target material 20 would be a BEOL dielectric stack, and center (first) opening 70 and lateral openings (90) become part of via opening.

A common stack would include at least a barrier layer dielectric overlying lower level line (Mx) and a upper level dielectric. The barrier layer typically contains nitrogen or could be any material that adequately inhibits metal migration from the Mx line. The upper level dielectric can be any dielectric material or stack of dielectric material. Commonly used upper level dielectrics include $SiO_2$, carbon-doped $SiO_2$ (SiCOH), porous SiCOH and their combinations.

The next step, step 70 in forming the BEOL fuse embodiment is shown in FIGS. 11A and 11B. Here, the target material 20 is patterned to form an upper level metal opening 310 (Mx+1 opening) which intersect via opening 90. As illustrated in FIG. 11B, the depth of the upper level metal opening is such that the bottom of the opening is below top of inner wall 100. This is merely, one embodiment, the bottom of the upper metal level opening 310 can be even with the top of the inner wall 100 or be above the top the inner wall 100.

The last step, step 80, in forming the BEOL fuse embodiment is shown in FIGS. 12A and C (there is no FIG. 12B). Here, a fill material 120 fills upper level metal opening 310 (Mx+1 opening) and via opening 90. In this embodiment (e-fuse), the fill material 120 is made of one or more conductors. For example the fill material may comprise a liner material and a bulk conductor. A liner material often acts as a diffusion barrier to the bulk conductor. Liners may include one or more of Ta, TaN, Ti, TiN or other compounds of a metal and nitrogen. The bulk conductor may be Al, Cu or W. The bulk conductor may be doped with another metal such as Mg, Mn, Co, Al, Cu or other metals. The bulk conductor may be capped with a metallic layer, for example, but not limitation, CoWP or CuMn.

The filled and planarized structure shown in FIG. 12B, is an excellent vertical e-fuse because the narrow lateral regions 90L and center 70 of the via 90 create areas of high current density which will likely fail by electromigration. In addition, when taking advantage of the sub-lithographic abilities of the invention the narrow lateral regions 90L and center 70 of the via 90 are so small that they may be difficult to perfectly fill with liner or bulk material. As a result, the imperfections create weak points susceptible to electromigration.

Figure 13:
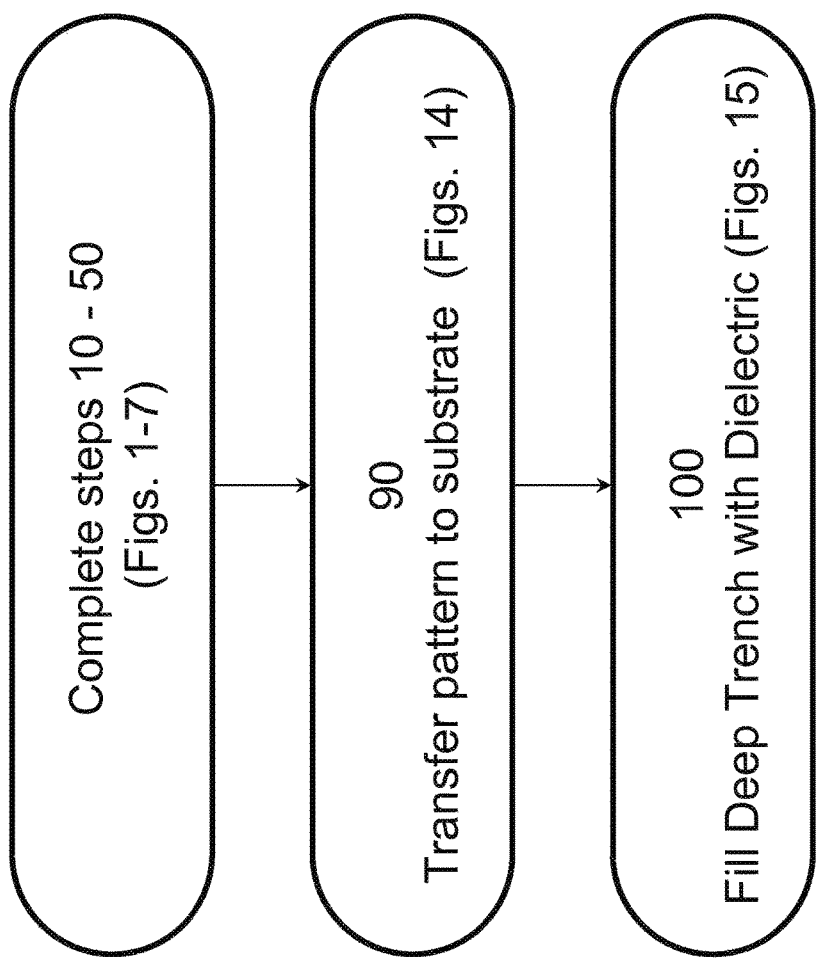
FIG. 13 is a flow chart of the method of creating a double-walled deep trench structure according to one embodiment.

With respect to the deep trench application, a deep trench having increased surface area is discussed in conjunction with FIGS. 13-15B. FIG. 13 gives the process flow. Initially, the fabrication steps are the same as shown in FIGS. 1A through 7C, then the process goes from step 50 to step 90 (FIGS. 14A and B). In step 90 the double wall pattern formed in the target material 20 is transferred to the substrate 10. In step 100 (FIGS. 15A and B), the deep trench is filled with fill material 120, which in the deep trench embodiment includes one or more dielectric layers 130.

Referring to FIG. 7C, in double wall deep trench embodiment, the substrate 10 would comprise a semiconductor material, for example, silicon. The target material 20 would be any material that can be etched slower than the substrate 10 with the appropriate plasma chemistry. For, example, in an embodiment where the substrate 10 is silicon the target material 20 may be silicon nitride.

The next step, step 90, in forming the deep trench embodiment is shown in FIGS. 14A and 14B. Here, the double walled pattern is transferred to the substrate 10 using target material 20 as a template. The double wall pattern includes center (first opening) 70 having inner wall 100 as its boundary at a radius r1; and lateral opening (second opening) 90L having inner wall 100 as its inner boundary at radius r2 and outer wall 110 as its outer boundary at radius r3. The top of Inner wall 100 is at a lower level height than outer wall 110 so that opening 90 is continuous at the top portion of the deep trench at a depth (d).

The last step, step 100 in forming the dee trench embodiment is shown in FIGS. 15A and 15B. Here, a fill material 120 fills center opening 70, lateral openings 90L and opening 90. The fill material may include one or more dielectric materials. For example the fill material may comprise one or more insulators such as silicon oxide, silicon nitride, doped glasses such as borophosphosilicate glass or other materials typical of deep trenches including those found in published U.S. Patent Application 20090174013 herein incorporated by reference in its entirety.

As before, depth (d) is from the top of the outer wall 110 to the top of inner wall Depth (d) can be from about 1 nm to about 1000 nm, and preferably between about 50 nm to about 1000 nm.

The advantage of the double walled deep trench structure of FIGS. 15A and 15B is that by having a double wall structure, the sidewall surface area of the deep trench is significantly increased compared to a single wall structure having the same deep trench depth. Here, by having an inner wall 100 in addition to the outer wall 110, the surface area ratio of the double walled structure increases by (r2+r1)/r3. Increased surface area is important because it increases the capacitance of the device. The capacitance of the device can be further tailored by changing the depth (d), a smaller d giving more surface area and thus higher capacitance.

The filled and planarized structure shown in FIG. 12B, is an excellent vertical e-fuse because the narrow lateral regions 90L and center 70 of the via 90 create areas of high current density which will likely fail by electromigration. In addition, when taking advantage of the sublithographic abilities of the invention the narrow lateral regions 90L and center 70 of the via 90 are so small that they may be difficult to perfectly fill with liner or bulk material. As a result, the imperfections create weak points susceptible to electromigration.

This concludes the description of double walled self-aligned, sub-resolution features made by a single lithography exposure. While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadcast interpretation so as to encompass all such modifications and equivalent structures and functions.

What is claimed is:

1. A double wall structure comprising:
    a circular center opening in a material; and
    a lateral opening in the material around the center opening;
    wherein the lateral opening has an outer wall and the lateral opening is separated from the center opening by an inner wall,
    wherein the circular center opening is surrounded on all sides by the lateral opening, and
    wherein the double wall structure comprises an electronic fuse.

2. The double wall structure of claim 1, wherein the inner wall is lower than the outer wall.

3. The double wall structure of claim 2, wherein the material comprises an insulator.

4. The double wall structure of claim 2, wherein the center and lateral openings are filled with a conductor.

5. The double wall structure of claim 1 wherein the circular center opening is sub-resolution relative to a previously formed opening above the circular center opening.

6. The double wall structure of claim 4, wherein the structure comprises a via.

7. The double wall structure of claim 1, wherein the material comprises a semiconductor, wherein the structure is filled with an insulator.

8. A sub-resolution double wall structure comprising:
a center opening in a target material; and
a pair of lateral openings in the target material flanking the center opening;
wherein each of the lateral openings has an outer wall and an inner wall and wherein each of the lateral openings is separated from the center opening by the inner wall;
wherein the center opening is sub-resolution relative to a previously formed opening above the center opening; and
wherein the double wall structure comprises an electronic fuse.

9. The double wall structure of claim 8, wherein the inner wall is lower than the outer wall.

10. The double wall structure of claim 9, wherein the material comprises an insulator.

11. The double wall structure of claim 9, wherein the center and lateral openings are filled with a conductor.

12. The double wall structure of claim 11, wherein the structure comprises a via.

13. The double wall structure of claim 8, wherein the material comprises a semiconductor, wherein the structure is filled with an insulator.

14. The double wall structure of claim 13, wherein the structure comprises a deep trench capacitor.

15. A double wall structure comprising:
a circular center opening in a material; and
a lateral opening in the material around the center opening;
wherein the lateral opening has an outer wall and the lateral opening is separated from the center opening by an inner wall,
wherein the circular center opening is sub-resolution relative to a previously formed opening above the circular center opening, and
wherein the double wall structure comprises an electronic fuse.

16. The double wall structure of claim 15, wherein the inner wall is lower than the outer wall.

17. The double wall structure of claim 16, wherein the material comprises an insulator.

18. The double wall structure of claim 16, wherein the center and lateral openings are filled with a conductor.

19. The double wall structure of claim 18, wherein the structure comprises a via.

20. The double wall structure of claim 15, wherein the material comprises a semiconductor, wherein the structure is filled with an insulator.

* * * * *